US010510867B2

(12) United States Patent
Hsieh et al.

(10) Patent No.: US 10,510,867 B2
(45) Date of Patent: *Dec. 17, 2019

(54) FINFETS AND METHODS OF FORMING THE SAME

(71) Applicant: Taiwan Semiconductor Manufacturing Company, Ltd., Hsinchu (TW)

(72) Inventors: Bor Chiuan Hsieh, Taoyuan (TW); Chung-Ting Ko, Kaohsiung (TW); Ting-Gang Chen, Taipei (TW); Chien Chung Huang, Taichung (TW); Tai-Chun Huang, Hsinchu (TW); Tze-Liang Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/222,610

(22) Filed: Dec. 17, 2018

(65) Prior Publication Data

US 2019/0140076 A1 May 9, 2019

Related U.S. Application Data

(63) Continuation of application No. 15/667,491, filed on Aug. 2, 2017, now Pat. No. 10,157,997.

(60) Provisional application No. 62/491,127, filed on Apr. 27, 2017.

(51) Int. Cl.
*H01L 29/66* (2006.01)
*H01L 29/78* (2006.01)

(52) U.S. Cl.
CPC .. *H01L 29/66545* (2013.01); *H01L 29/66795* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Fernando L Toledo
*Assistant Examiner* — Valerie N Newton
(74) *Attorney, Agent, or Firm* — Slater Matsil, LLP

(57) ABSTRACT

A method includes forming a dummy gate stack on a substrate, forming a spacer layer on the dummy gate stack, forming an etch stop layer over the spacer layer and the dummy gate stack, the etch stop layer comprising a vertical portion and a horizontal portion, and performing a densification process on the etch stop layer, wherein the horizontal portion is denser than the vertical portion after the densification process The method also includes forming an oxide layer over the etch stop layer, performing an anneal process on the oxide layer and the etch stop layer, wherein the vertical portion has a greater concentration of oxygen than the horizontal portion after the anneal process.

20 Claims, 16 Drawing Sheets

(56) References Cited

U.S. PATENT DOCUMENTS

| | | | |
|---|---|---|---|
| 9,576,814 B2 | 2/2017 | Wu et al. | |
| 10,157,997 B2 * | 12/2018 | Hsieh | H01L 29/66545 |
| 2014/0091395 A1 | 4/2014 | Liu et al. | |
| 2017/0162663 A1 | 6/2017 | Tsai et al. | |

* cited by examiner

FINFETS AND METHODS OF FORMING THE SAME

PRIORITY CLAIM AND CROSS-REFERENCE

This application is a continuation of U.S. patent application Ser. No. 15/667,491, filed on Aug. 2, 2017, and entitled "FinFETs and Methods of Forming the Same" which claims priority to U.S. Provisional Patent Application No. 62/491,127, filed Apr. 27, 2017, and entitled "FinFET Device and Method of Forming the Same," which applications are hereby incorporated herein by reference.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, implanting the semiconductor fins to form well regions, forming dummy gate electrodes on the semiconductor fins, performing an epitaxy to grow source/drain regions, and forming contacts to the source/drain regions and gate electrodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
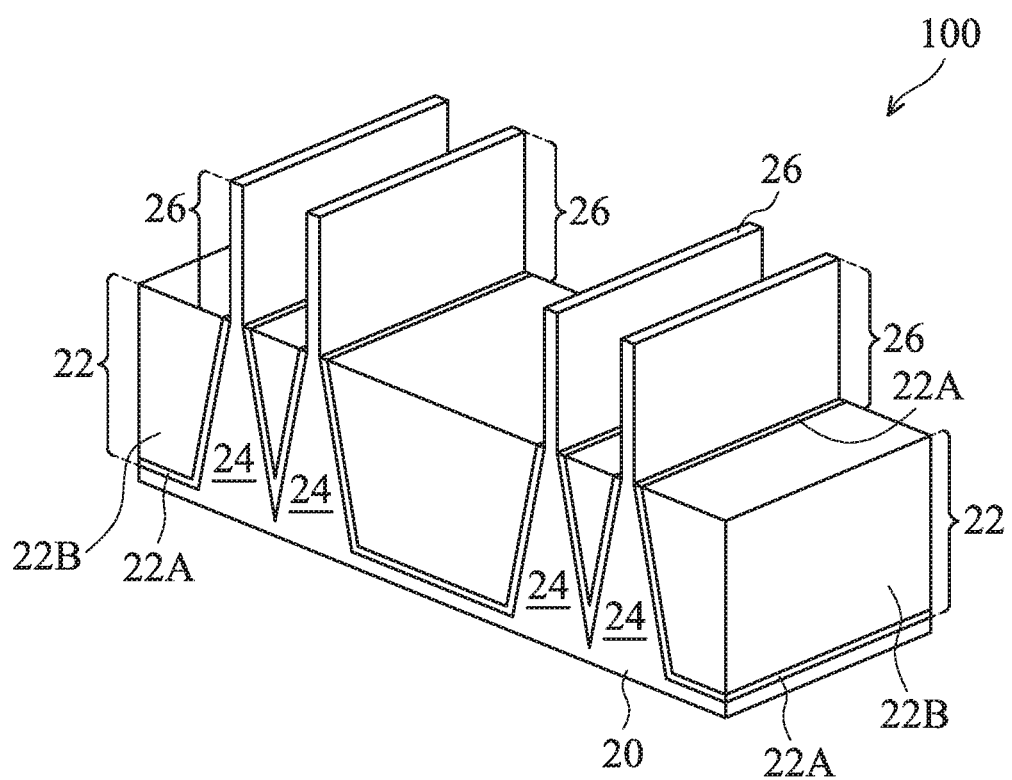
FIGS. 1 through 14 are cross-sectional views and perspective views of intermediate stages in the formation of a Fin Field-Effect Transistor (FinFET) in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

FIGS. 1 through 14 illustrate the perspective views and cross-sectional views of intermediate stages in the formation of a FinFET in accordance with some embodiments of the present disclosure. The steps shown in FIG. 1 through 13 are also reflected schematically in the process flow 200 shown in FIG. 15.

FIG. 1 illustrates a perspective view of substrate 20, which may be a part of wafer 100. Substrate 20 may be a semiconductor substrate, such as a silicon substrate, a silicon carbon substrate, a silicon-on-insulator substrate, a III-V compound semiconductor substrate, or a substrate formed of other semiconductor materials. Substrate 20 may be lightly doped with a p-type or an n-type impurity.

Isolation regions 22, which are alternatively referred to as Shallow Trench Isolation (STI) regions, are formed to extend into semiconductor substrate 20. The formation of STI regions may include etching substrate 20 to form trenches (shown as filled by STI regions 22), and filling the trenches with a dielectric layer(s). A planarization such as a Chemical Mechanical Polish (CMP) is performed to level the top surface of the dielectric material with the top surface of the respective mask, such as a hard mask (not shown) used for defining the patterns of STI regions 22. The mask is then removed, followed by recessing STI regions 22, and the resulting structure is shown in FIG. 1.

In accordance with some embodiments of the present disclosure, STI regions 22 include liner oxide 22A and dielectric material 22B over liner oxide 22A. Liner oxide 22A is formed by oxidizing wafer 100 in an oxygen-containing environment, for example, through Local Oxidation of Silicon (LOCOS), where oxygen ($O_2$) may be included in the respective process gas. In accordance with other embodiments of the present disclosure, liner oxide 22A is formed using In-Situ Steam Generation (ISSG), for example, with water steam or a combined gas of hydrogen ($H_2$) and oxygen ($O_2$) used to oxidize semiconductor strips 24 between the trenches. In accordance with yet other embodiments, liner oxide 22A is formed using a deposition method such as Sub Atmospheric Chemical Vapor Deposition (SACVD). Dielectric material 22B is formed over liner oxide 22A. The formation method of dielectric material 22B may be selected from Flowable Chemical Vapor Deposition (FCVD), Chemical Vapor Deposition (CVD), Atomic Layer Deposition (ALD), spin-on coating, and the like.

Throughout the description, the portions of semiconductor substrate 20 between neighboring STI regions 22 are referred to as semiconductor strips 24. Due to the recessing of STI regions 22, portions of the semiconductor strips 24 are formed to protrude higher than the top surfaces of STI regions 22 forming semiconductor fins 26. In accordance with some embodiments of the present disclosure, semiconductor fins 26 and semiconductor strips 24 are parts of the original semiconductor substrate 20. In accordance with alternative embodiments, semiconductor fins 26 (and possibly some top parts of semiconductor strips 24) are epitaxy regions formed of a semiconductor material different from the material of substrate 20. For example, semiconductor fins 26 may be formed of silicon germanium (SiGe). The step of forming the semiconductor fins 26 is shown as step 202 in the process flow 200 shown in FIG. 15.

In some embodiments, semiconductor fins 26 may be formed by a patterning process. Semiconductor fins 26 or semiconductor strips 24 may be patterned by any suitable method. For example, semiconductor fins 26 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 26.

Figure 2:
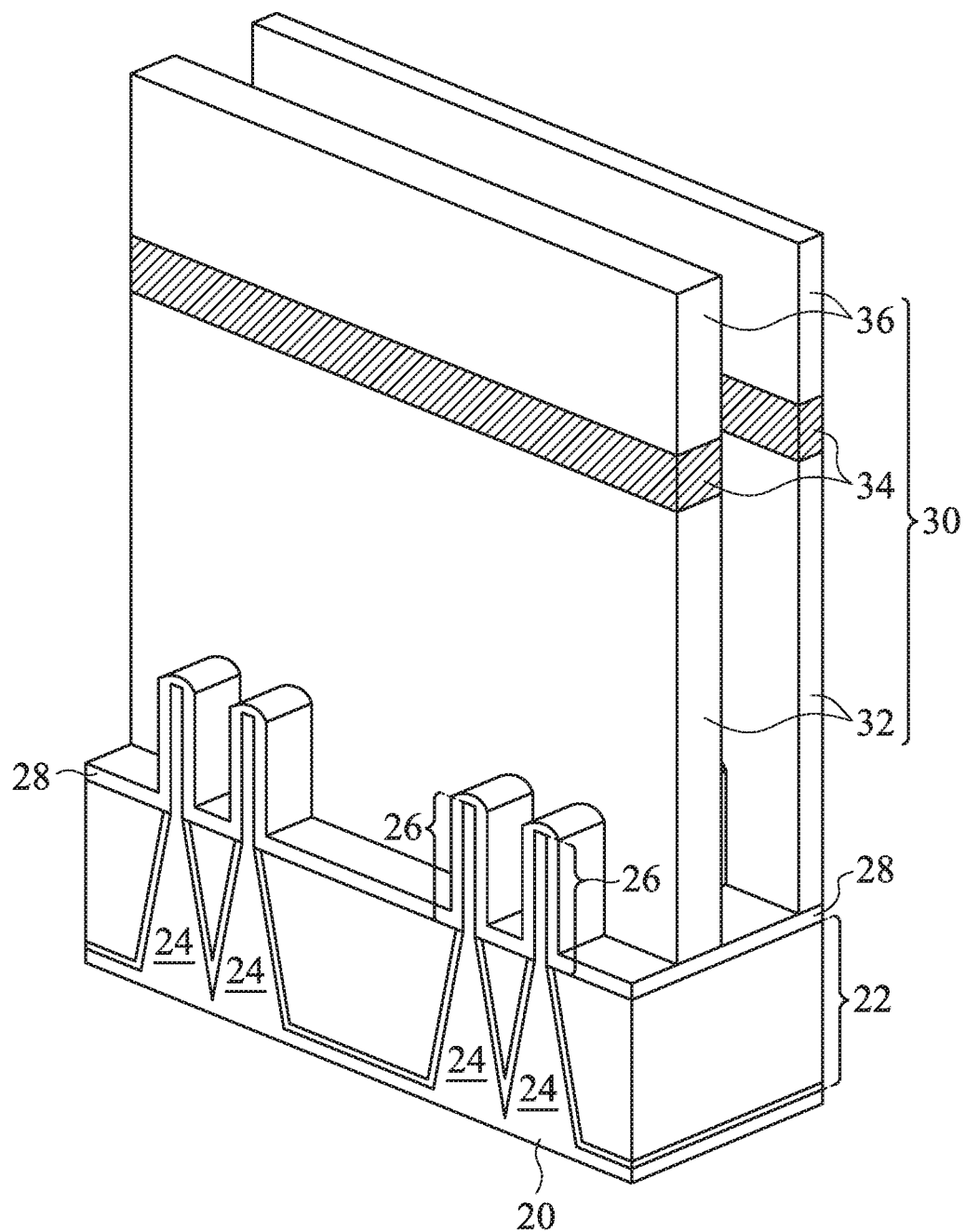

FIG. 2 illustrates the formation of dummy gate dielectric layer 28, which may include silicon oxide or a composite layer including a plurality of dielectric layers, for example. Dummy gate dielectric layer 28 is referred to as dummy gate oxide layer hereinafter. In accordance with some embodiments of the present disclosure, dummy oxide layer 28 is formed through deposition, and hence extends on the top surfaces of STI regions 22. In accordance with alternative embodiments of the present disclosure, dummy oxide layer 28 is formed through oxidizing the surface layers of semiconductor fins 26. Accordingly, dummy oxide layer 28 is formed on the exposed surfaces of semiconductor fins 26, and does not include horizontal portions extending on the top surfaces of STI regions 22.

FIG. 2 further illustrates the formation of dummy gate stack 30 on the middle portions of semiconductor fins 26. In accordance with some embodiments of the present disclosure, dummy gate stack 30 includes dummy gate electrode 32 and mask layers 34 and/or 36. Dummy gate electrode 32 may be formed of polysilicon in accordance with some embodiments, and other materials may also be used. In accordance with some exemplary embodiments, mask layer 34 is formed of silicon nitride, and mask layer 36 is formed of silicon oxide. Dummy gate stack 30 extends on the top surfaces and the sidewalls of semiconductor fins 26. In accordance with some embodiments of the present disclosure, the formation of dummy gate stack 30 includes forming a blanket gate electrode layer and blanket mask layers, and then patterning the blanket gate electrode layer and the blanket mask layers. The patterning is stopped on the top surfaces of dummy oxide layer 28. The dummy gate stack formation step is shown as step 204 in the process flow 200 shown in FIG. 15.

In accordance with some embodiments of the present disclosure, after the patterning of the dummy gate electrode layer, the patterning is stopped, and the portions of dummy oxide layer 28 that are directly underlying the removed parts of the dummy gate electrode layer are exposed. The exposed portions of dummy oxide layer 28 are not removed in accordance with these embodiments. Rather, the exposed portions of dummy oxide layer 28 are removed after the subsequently performed anneal. In accordance with alternative embodiments of the present disclosure, the exposed portions of dummy oxide layer 28 are removed, and the remaining portions of dummy oxide layer 28 become the bottom parts of dummy gate stack 30. When the exposed portions of dummy oxide layer 28 are removed, semiconductor fins 26 are exposed.

Figure 3:
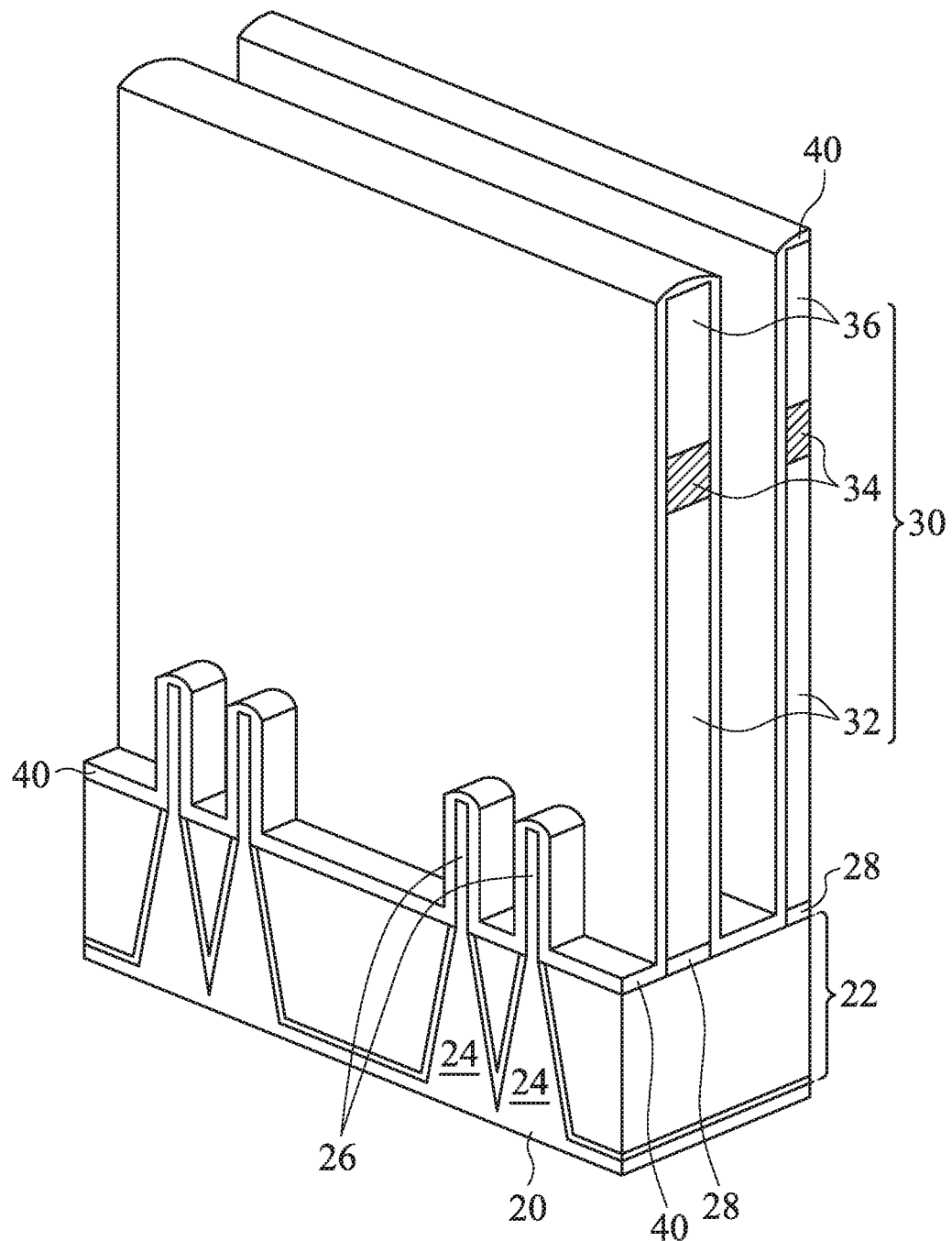

Referring to FIG. 3, gate spacer layer 40 is formed as a blanket layer. Throughout the description, although layer 40 is referred to as a "gate spacer layer," it also extends onto the sidewalls of fins, and hence is also referred to as a "spacer layer." In accordance with some embodiments of the present disclosure, gate spacer layer 40 is formed using a conformal deposition method such as ALD, CVD, etc., so that the sidewall portions of gate spacer layer 40 have an adequate thickness. The horizontal portions and vertical portions of gate spacer layer 40 may have substantially the same thickness, for example, with thickness of the vertical portions and thickness of horizontal portions having a difference smaller than 20 percent of the thickness of the vertical portions or the thickness of the horizontal portions. In accordance with some exemplary embodiments of the present disclosure, the thickness of the vertical portions or the thickness of the horizontal portions are in the range between about 1 nm and about 20 nm.

Figure 4:
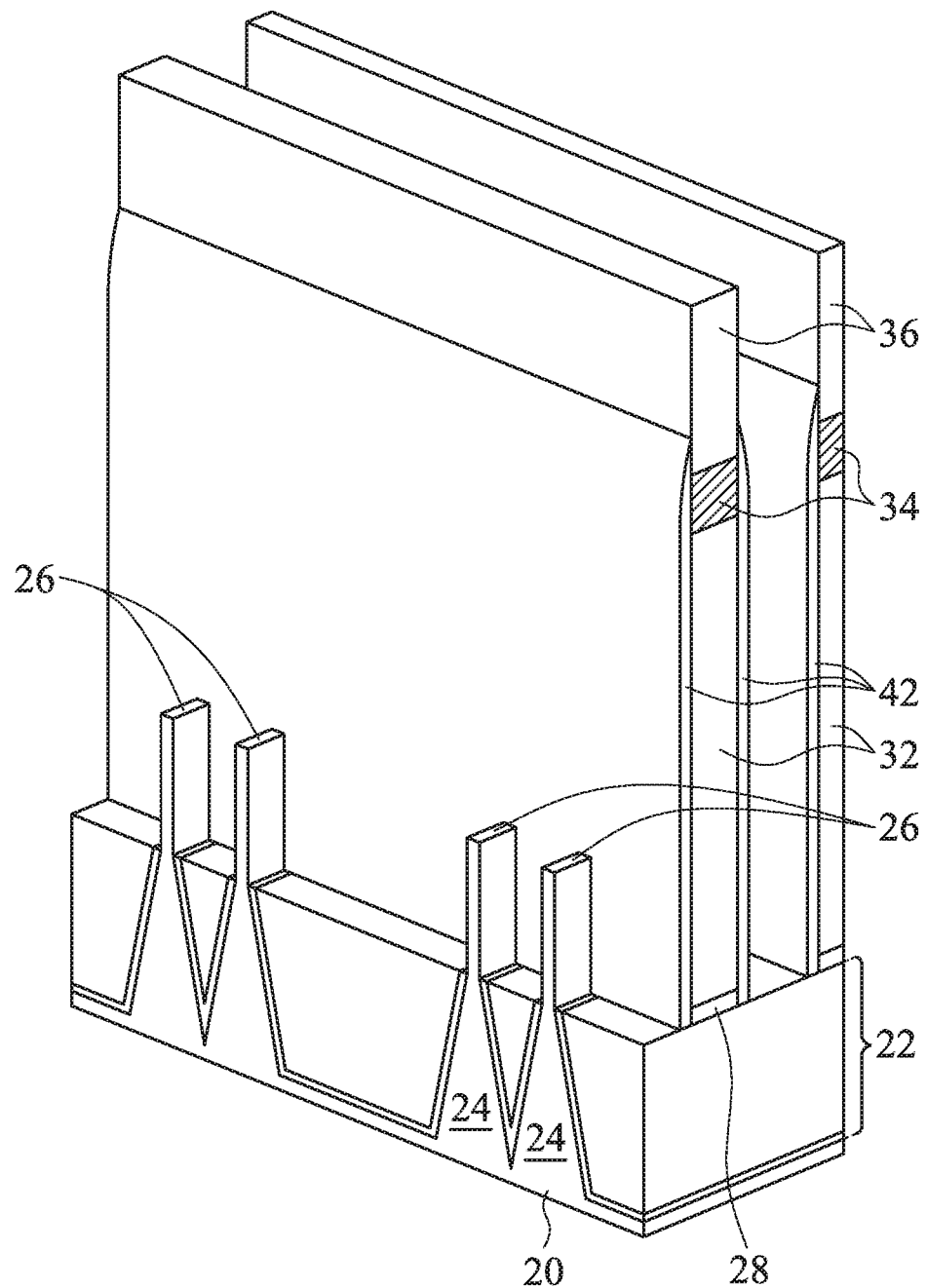

The material of gate spacer layer 40 may include silicon oxy-carbonitride (SiOCN), silicon carbo-nitride (SiOC), or a metal oxide such as aluminum oxide. In accordance with some embodiments of the present disclosure, gate spacer layer 40 is formed of SiOCN, and may have a single-layer structure. In accordance with alternative embodiments, gate spacer layer 40 has a composite structure including a plurality of layers. For example, gate spacer layer 40 may include a silicon oxide layer, and a silicon nitride layer over the silicon oxide layer. Referring to FIG. 4, an anisotropic etching is performed to remove the horizontal portions of spacer layer 40. The remaining vertical portions of spacer layer 40 form gate spacers 42 on the sidewalls of dummy gate stack 30. In some embodiments, portions of the spacer layer 40 remain on the sidewalls of semiconductor fins 26 as fin spacers. The step of etching the spacer layer 40 is shown as step 206 in the process flow 200 shown in FIG. 15.

Figure 5A:
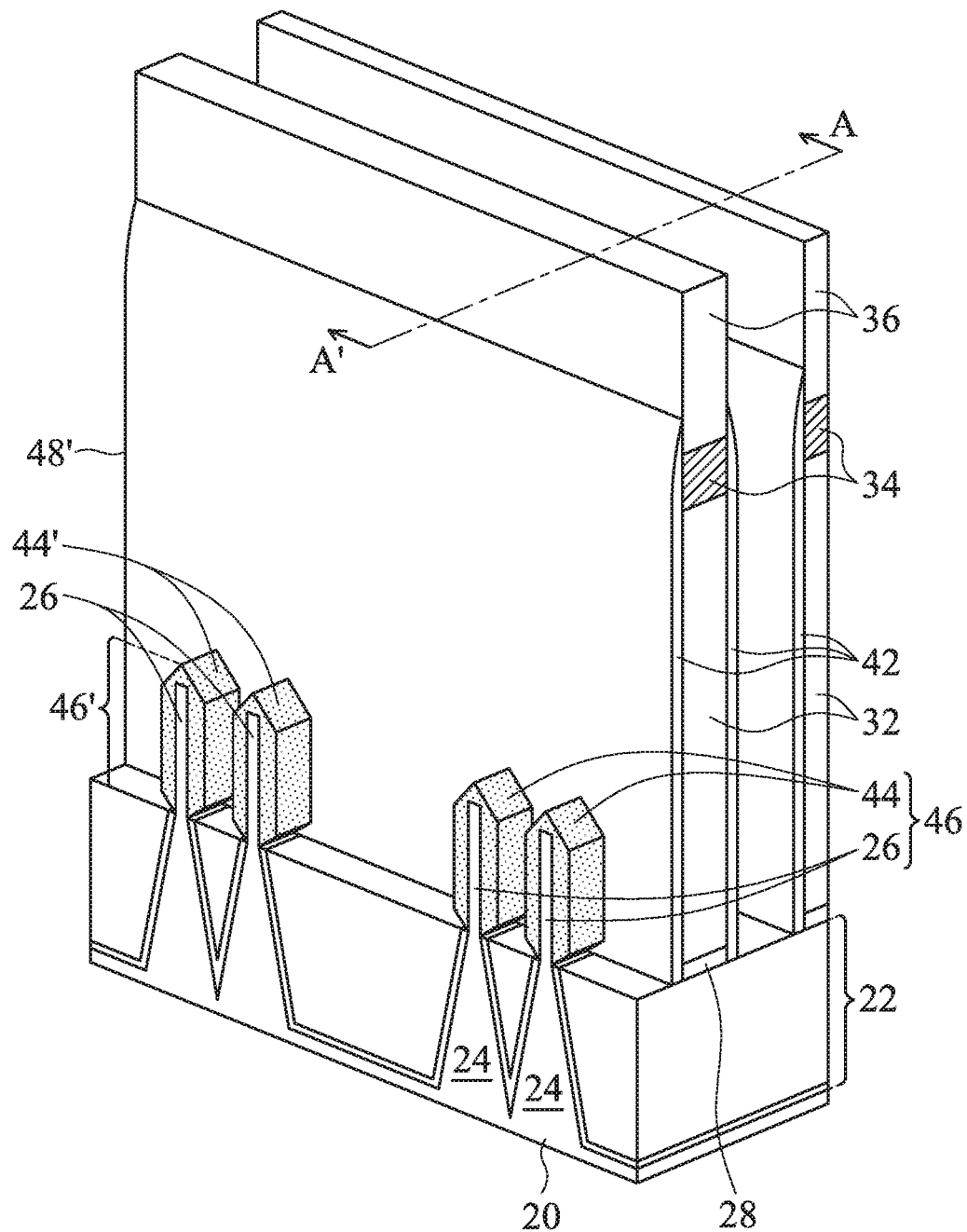
Figure 5B:
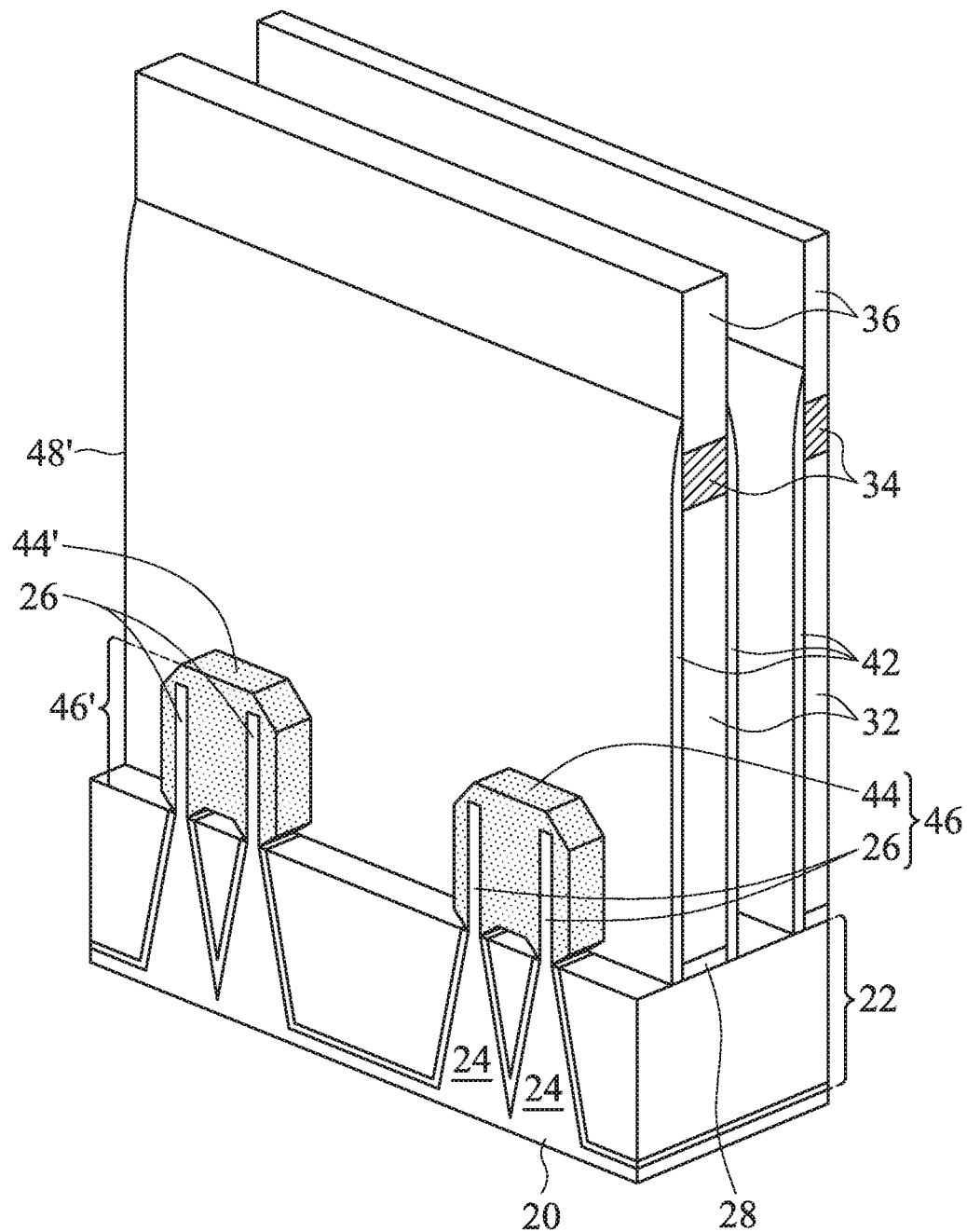

FIG. 5A illustrates growing epitaxy regions 44 and 44' on the respective semiconductor fins 26. Epitaxy regions 44 and the respective underlying semiconductor fins 26 in combination form the source and drain regions (referred to as source/drain regions hereinafter) 46. Epitaxy regions 44' and the respective underlying semiconductor fins 26 in combination form source/drain regions 46'. In some embodiments, exposed portions of semiconductor fins 26 are removed to form recesses in semiconductor strips 24 (not shown), and epitaxy regions 44 and 44' are grown protruding from the recesses. The exposed portions of semiconductor fins 26 may be removed by a wet etch process, a dry etch process, or a combination. In accordance with some embodiments, epitaxy regions 44 include silicon phosphorous (SiP) or phosphorous-doped silicon carbon (SiCP), and the resulting FinFET is an n-type FinFET. Epitaxy regions 44' may include SiGe and a p-type impurity such as boron or indium, which may be in-situ doped during the epitaxy, and the resulting FinFET is a p-type FinFET. Epitaxy regions 44 or epitaxy regions 44' may include other materials or dopants in other embodiments. In some embodiments, epitaxy regions 44 or epitaxy regions 44' are doped after formation. Since epitaxy regions 44 of the n-type FinFET is different from epitaxy regions 44' of the p-type FinFET, the p-type and n-type FinFETs need to be formed separately. Epitaxy regions 44 and epitaxy regions 44' may be formed by a process such as by metal-organic CVD (MOCVD), molecular beam epitaxy (MBE), liquid phase epitaxy (LPE), vapor phase epitaxy (VPE), selective epitaxial growth (SEG), the like, or a combination thereof. FIG. 5A shows epitaxy regions 44 and epitaxy regions 44' as being formed separately over separate semiconductor fins 26, but in some embodiments, epitaxy regions 44 and epitaxy regions 44' are formed merged over adjacent semiconductor fins 26, as shown in FIG. 5B.

In some embodiments, epitaxy regions 44 or epitaxy regions 44' may each be formed in a single, continuous epitaxial process. In other embodiments, epitaxy regions 44 or epitaxy regions 44' may each be formed in multiple separate epitaxial processes. Epitaxy regions 44 or epitaxy regions 44' may be doped such that its doping concentration has a concentration gradient, an abrupt change in concentration, or another doping concentration profile. In some embodiments, a capping layer (not shown) may be formed over epitaxy regions 44 or epitaxy regions 44'. The capping layer may include a material such as Si, SiP, SiGe, SiGeP, or the like. The capping layer may be formed by a process such as by metal-organic CVD (MOCVD), molecular beam epitaxy (MBE), liquid phase epitaxy (LPE), vapor phase epitaxy (VPE), selective epitaxial growth (SEG), the like, or a combination thereof.

Figure 6:
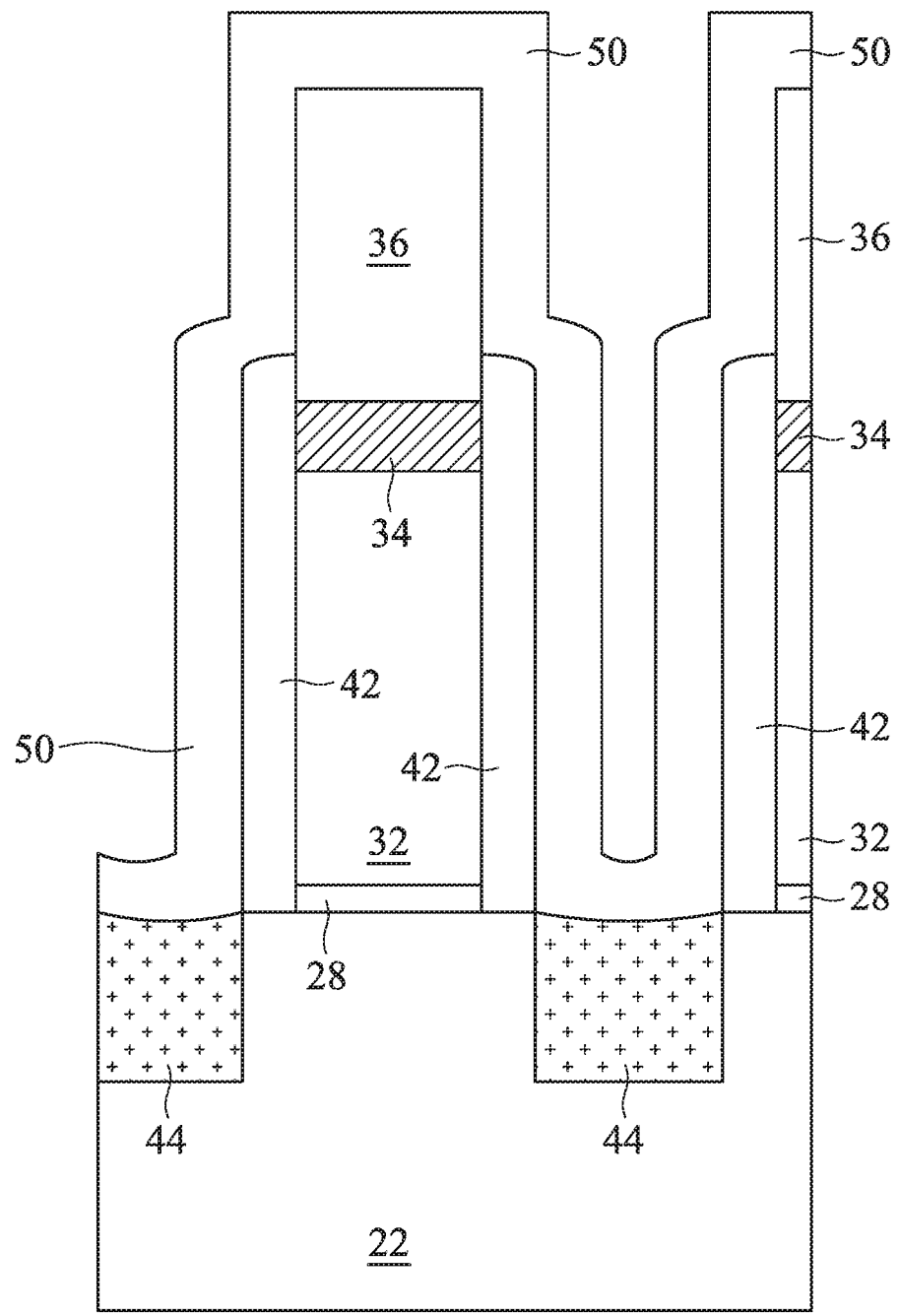
Figure 8:
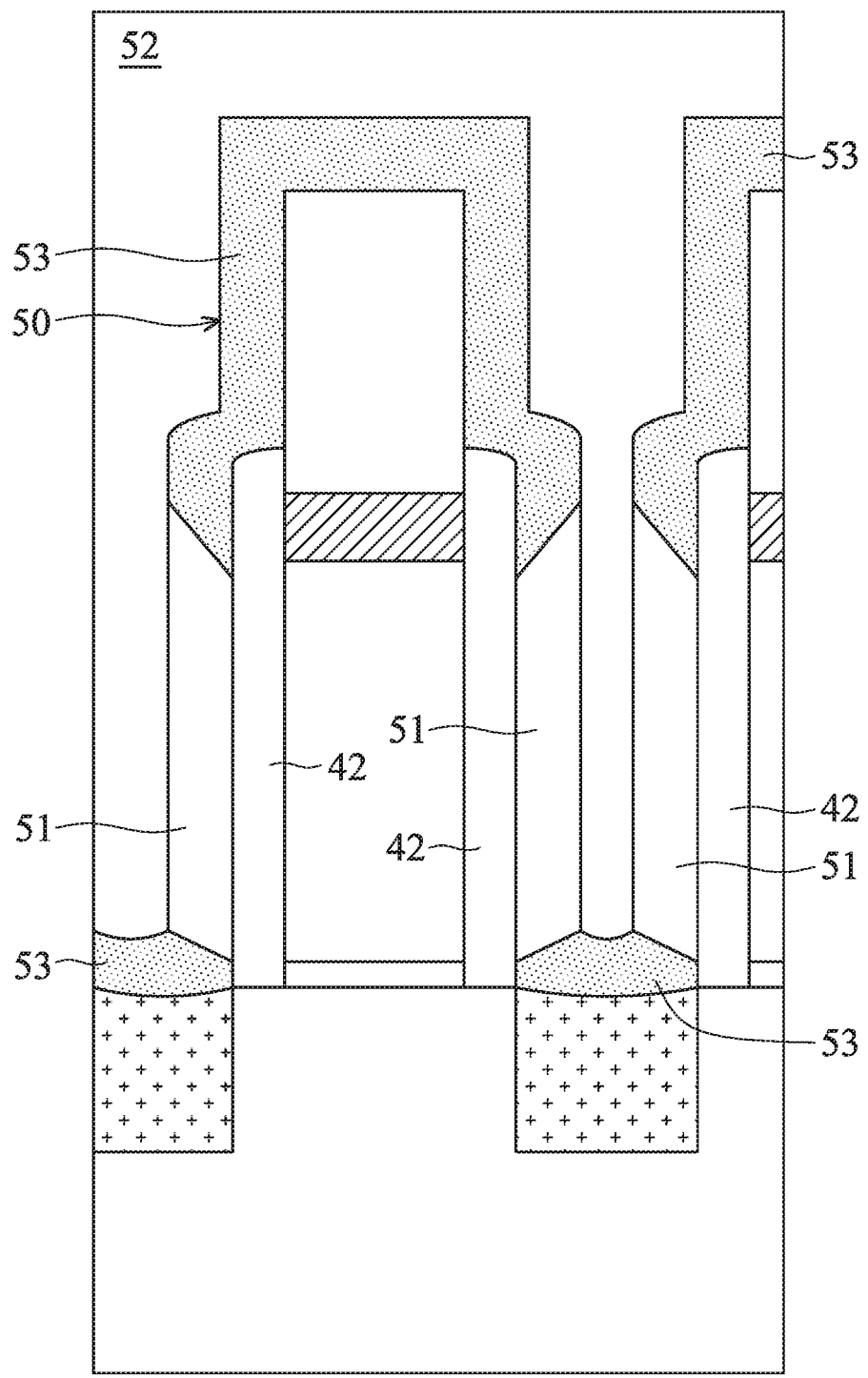
Figure 9:
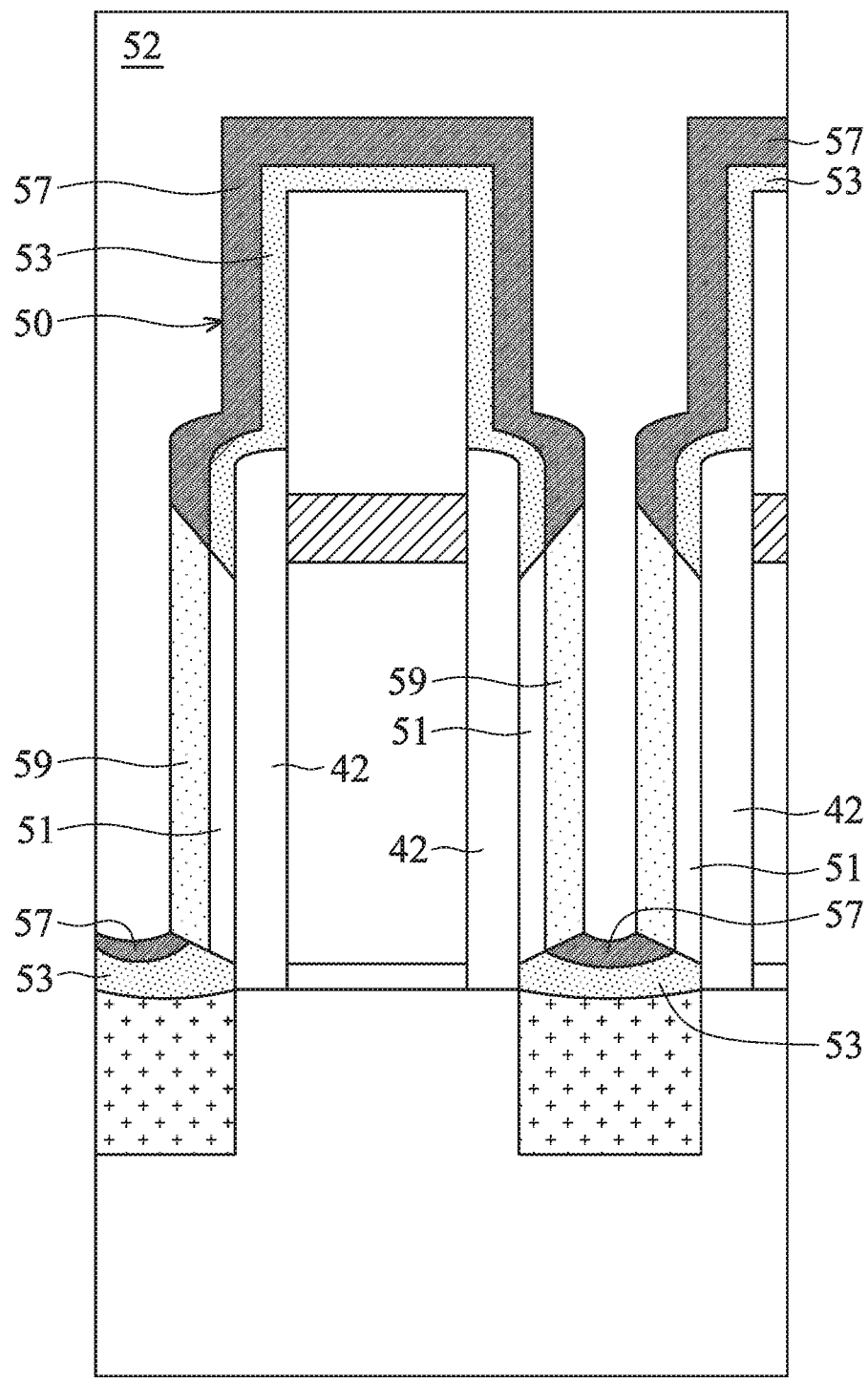

FIG. 6 illustrates a cross-sectional view of a portion of the structure shown in FIG. 5A, wherein the cross-sectional view is obtained from the vertical plane crossing line A-A' in FIG. 5A. The cross-sectional view shown in subsequent FIGS. 7 through 9 are also obtained from the same vertical plane crossing line A-A' as shown in FIG. 5A.

As shown in FIG. 6, Contact Etch Stop Layer (CESL) 50 is formed to conformally cover the structure shown in FIG. 5. In some embodiments, CESL 50 includes SiN, SiO$_2$, SiCN, SiON, SiNH, or the like, but other suitable dielectric materials may be used. CESL 50 may also include multiple layers or combinations of materials. CESL 50 may be deposited through one or more processes such as Physical Vapor Deposition (PVD), Atomic Layer Deposition (ALD), Plasma-Enhanced Atomic Layer Deposition (PE-ALD), Chemical Vapor Deposition (CVD), or the like, although any acceptable process may be used. In some embodiments, CESL 50 may be deposited to a thickness between about 30 nm and about 50 nm, though CESL 50 may be deposited to other thicknesses in other embodiments. The step of forming CESL 50 is shown as step 208 in the process flow 200 shown in FIG. 15.

Figure 7:
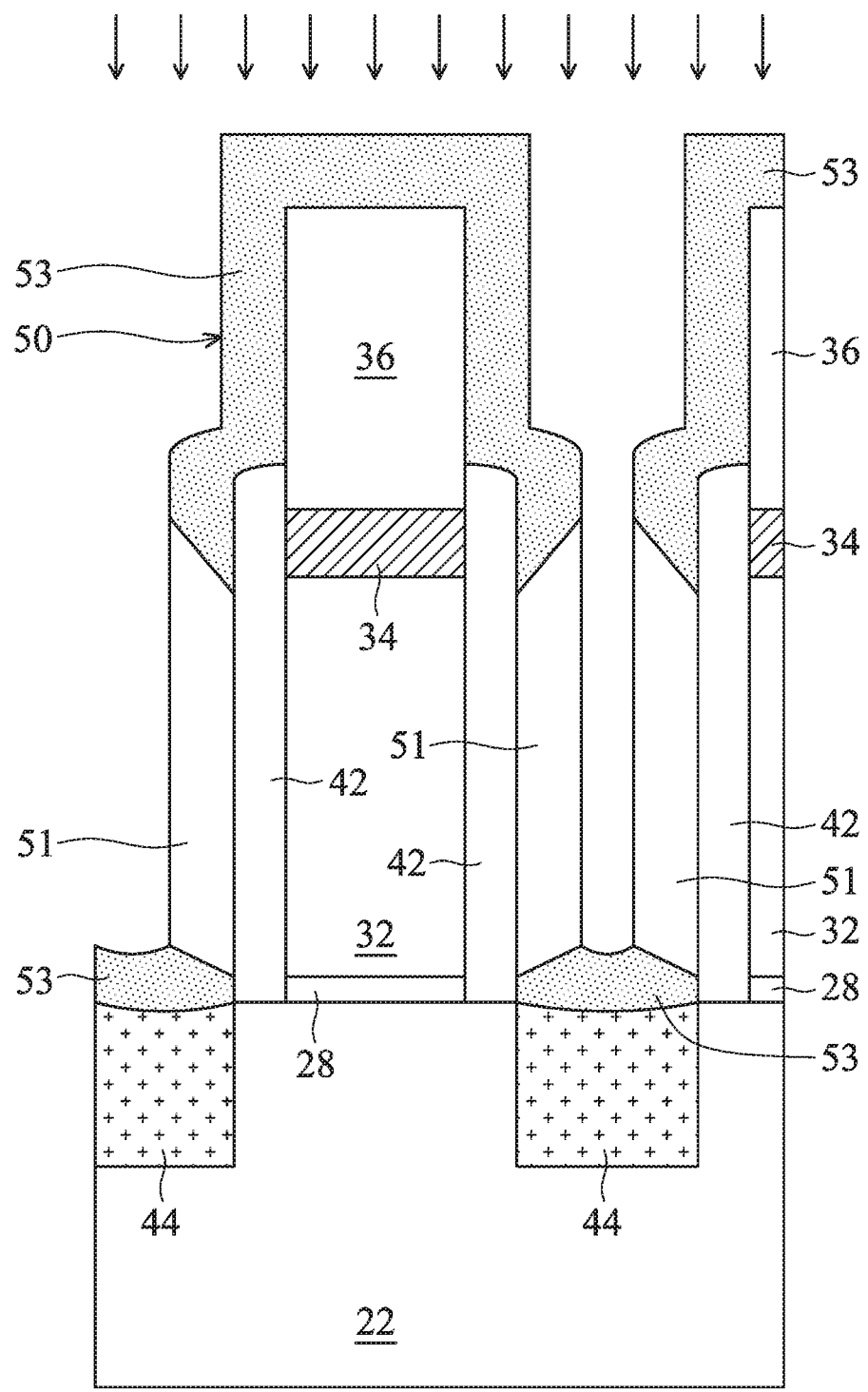

FIG. 7 illustrates a densification process (illustrated in FIG. 7 by arrows) that densifies portions of CESL 50 in accordance with some embodiments of the present disclosure. In some embodiments, the densification process is directional, in that portions of CESL 50 having more horizontally-oriented surfaces are densified more than portions of CESL 50 having more vertically-oriented surfaces. An example is illustrated in FIG. 7, in which some horizontal CESL portions 53 of CESL 50 are denser than vertical CESL portions 51 of CESL 50. The designations of less dense vertical CESL portions 51 and more dense horizontal CESL portions 53 are for illustrative purposes, the locations or positions may be different in other embodiments, and may depend on properties of the CESL 50 or the densification process. The density differences between horizontal CESL portions 53 and vertical CESL portions 51 may be a smooth or abrupt transition (i.e., a density gradient). In some cases, the densification process does not change the density of vertical CESL portions 51. In some cases, the densification process may result in vertical CESL portions 51 having a higher wet etch rate (WER) than horizontal CESL portions 53. For example, vertical CESL portions 51 may have a WER about 1.5 times greater than horizontal CESL portions 53 after the densification process, though the relative WER may be different in other cases. The step of the densification process is shown as step 210 in the process flow 200 shown in FIG. 15.

In some embodiments, the densification process includes a plasma process. For example, a plasma process may be used to bombard CESL 50 with ions to densify the horizontal CESL portions 53. In some embodiments, the ions may be argon ions, helium ions, nitrogen ions, hydrogen ions, ions of an inert gas, a combination of these, or another type of ions. The ions may be accelerated at CESL 50 with a directional bias. For example, the ions bombard CESL 50 in a direction substantially perpendicular to the surface of substrate 20, but in other embodiments, the ions bombard CESL 50 at an angle to the perpendicular direction. In some embodiments, a direct plasma is used to generate the directional bias. The energies of the ions may be chosen to enhance or reduce directionality toward CESL 50, or enhance or reduce scattering within CESL 50. For example, the ions may have energies between about 0.1 eV and about 3.5 eV. In some embodiments, the substrate has a temperature between about 200° C. and about 700° C. In some embodiments, the densification process is performed after the deposition of CESL 50, but in other embodiments the densification process is performed during the deposition of CESL 50. For example, CESL 50 may be deposited using a PE-ALD process in which ions (e.g., argon ions or other ions) bombard portions of CESL 50 as it is being formed. Other processes or techniques for densification of portions of CESL 50 may also be used in other embodiments.

Referring to FIG. 8, an Inter-Layer Dielectric (ILD) 52 is then formed over CESL 50 in accordance with some embodiments of the present disclosure. ILD 52 may include a material such as SiO$_2$, SiON, the like, or other dielectric materials, and ILD 52 may include combinations of materials or multiple layers of different materials. ILD 52 may be deposited through one or more processes such as PVD, CVD, or ALD, although any acceptable process may be utilized. In some embodiments, ILD 52 is formed using a flowable oxide, such as a flowable CVD oxide or other flowable dielectric, or is formed using a spin-on dielectric material. The step of forming ILD 52 is shown as step 212 in the process flow 200 shown in FIG. 15.

Referring to FIG. 9, an oxidation anneal process is then performed in accordance with some embodiments of the present disclosure. The oxidation anneal process can improve the physical properties of ILD 52 and can also oxidize portions of CESL 50. In some embodiments, the oxidation anneal process is a steam anneal process. The oxidation anneal process may be performed in an anneal chamber different from a chamber used to form CESL 50 or perform the densification process described above. In some embodiments, oxidation anneal process is performed at a temperature between about 350° C. and about 700° C., and at a pressure between about 1 torr and about 760 torr, though other values may also be used. In some embodiments, the duration of the oxidation anneal process is between about 30 minutes and about 480 minutes, though other values may also be used. The step of the oxidation anneal process is shown as step 214 in the process flow 200 shown in FIG. 15.

In some embodiments, the oxidation anneal process allows oxygen atoms to be incorporated into portions of CESL 50. Due to the densification process performed on the CESL 50, however, oxygen is incorporated into the vertical CESL portions 51 at a greater rate than oxygen is incorporated into the denser horizontal CESL portions 53. In FIG. 9, this is illustrated by oxygenated vertical CESL portions 59 and oxygenated horizontal CESL portions 57. FIG. 8 also illustrates remaining vertical CESL portions 51 and horizontal CESL portions 53 without incorporated oxygen. In some cases, oxygen may be incorporated into vertical CESL portions 51 such that parts of oxygenated vertical CESL portions 59 extend all the way to the gate spacers 42. In some cases, oxygen may be incorporated into all of vertical CESL portions 51. In some cases, no oxygen may be incorporated into horizontal CESL portions 53. The amount, rate, and concentration of oxygen incorporated into the vertical CESL portions 51 or horizontal CESL portions 53 may be adjusted by controlling the parameters of the oxidation anneal process. In some embodiments, between about 30% and about 60% of the vertical CESL portions 51 may be converted to $SiO_2$. In some embodiments, between about 5% and about 12% of the horizontal CESL portions 53 may be converted to $SiO_2$. In other embodiments, other amounts of portions of CESL 50 may be converted to $SiO_2$. In some cases, other elements such as hydrogen may also be incorporated into portions of CESL 50.

As an illustrative example, for a CESL 50 made of SiN, the oxidation anneal process may convert portions of CESL 50 to SiON or $SiO_2$. For example, some of vertical CESL portions 51 may be converted to SiON or $SiO_2$, indicated by oxygenated vertical CESL portions 59 as shown in FIG. 9. In some cases, some of horizontal CESL portions 53 may be converted to SiON or $SiO_2$, indicated by oxygenated horizontal CESL portions 57 as shown in FIG. 9. In some cases, all of vertical CESL portions 51 or horizontal CESL portions 53 may be converted to SiON or $SiO_2$. For example, ILD 52 may be $SiO_2$, oxygenated vertical CESL portions 59 or oxygenated horizontal CESL portions 57 may be SiON, and remaining vertical CESL portions 51 or horizontal CESL portions 53 may be SiN. In other embodiments, oxygenated vertical CESL portions 59 or oxygenated horizontal CESL portions 57 may also be $SiO_2$. The concentration of oxygen present in oxygenated vertical CESL portions 59 or oxygenated horizontal CESL portions 57 may have a concentration profile, such as a smooth transition or an abrupt transition from a high concentration to a low concentration, or another concentration profile. In some cases, the concentration of oxygen in oxygenated vertical CESL portions 59 or oxygenated horizontal CESL portions 57 may be lower nearer to gate spacers 42. In some cases, the thickness of vertical CESL portions 51 that remains as SiN may be between about 0.5 nm and about 3 nm, though in other cases may have other thicknesses. In other embodiments, vertical CESL portions 51 without incorporated oxygen may not be present after the oxidation anneal process.

In this manner, some or all of the CESL 50 adjacent gate spacers 42 may be converted from SiN to SiON or $SiO_2$. This can result in a thinner layer of the SiN CESL layer adjacent gate spacers 42, or can result in all of the SiN CESL layer adjacent gate spacer layer being converted to SiON or $SiO_2$. As SiN has a dielectric constant (k) of about 7, $SiO_2$ has a dielectric constant (k) of about 3.9, and SiON has a dielectric constant (k) between about 7 and about 3.9 depending on the particular concentrations of oxygen and nitrogen. Thus, the dielectric constant or thickness of some or all of the dielectric later adjacent gate spacer 42 may be reduced. By reducing the dielectric constant or thickness of the dielectric layer adjacent gate spacers 42, any parasitic capacitance in the device associated with this dielectric layer adjacent gate spacers 42 may also be reduced. Reducing the parasitic capacitance may improve the operation of the device, such as improving the device's AC performance.

Figure 10:
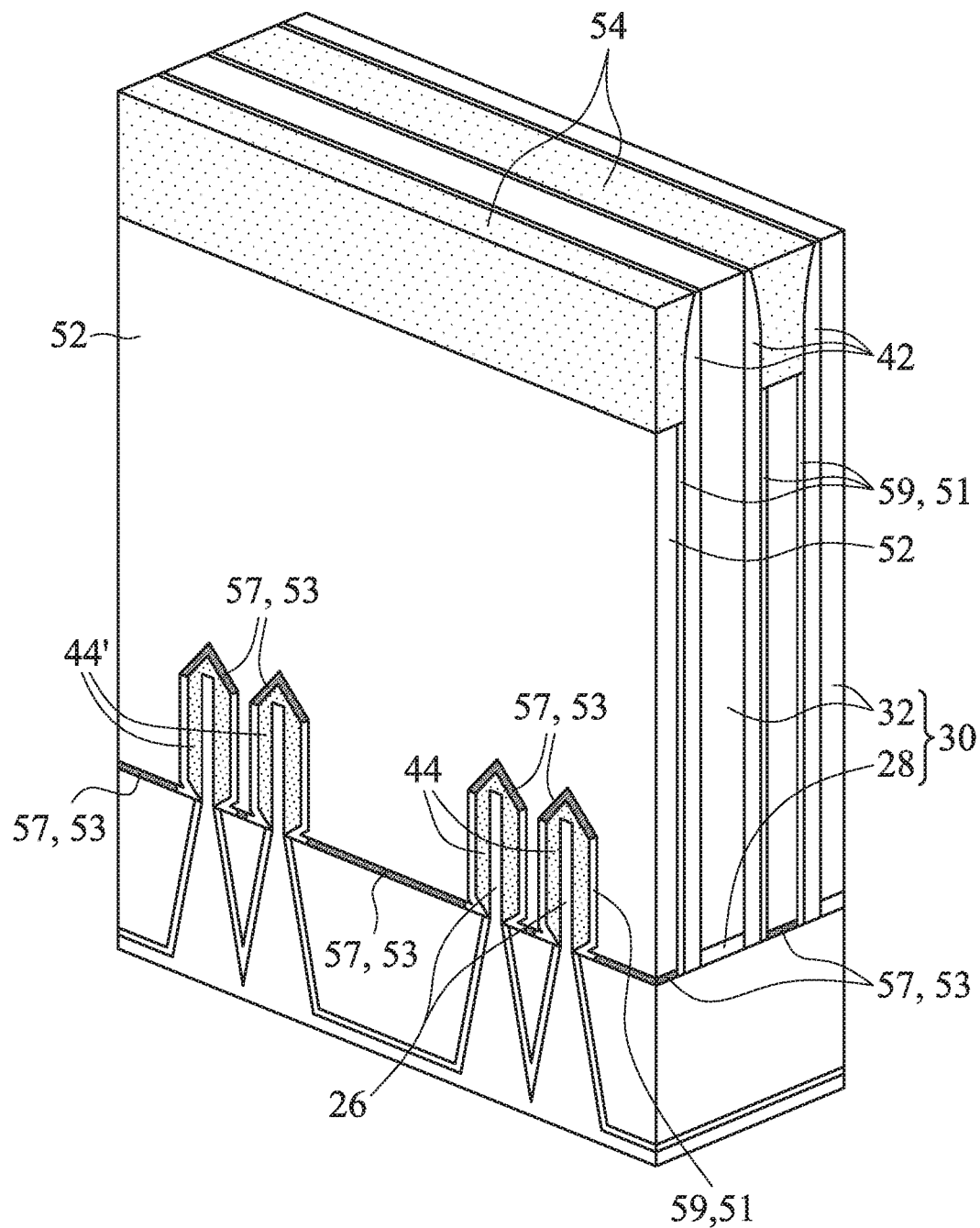

Next, as shown in FIG. 10, a CMP is then performed to level the top surfaces of ILD 52 and gate spacers 42 with each other. The CMP may be performed using dummy gate electrode 32 as a CMP stop layer, or alternatively, mask layer 34 or 36 (FIG. 3) may be used as the CMP stop layer. ILD 52 may then be recessed, and mask layer 54 is filled into the recess, followed by another CMP process, so that the top surfaces of mask layer 54 are coplanar with the top ends of gate spacers 42 and the remaining dummy gate electrode 32.

Figure 11:
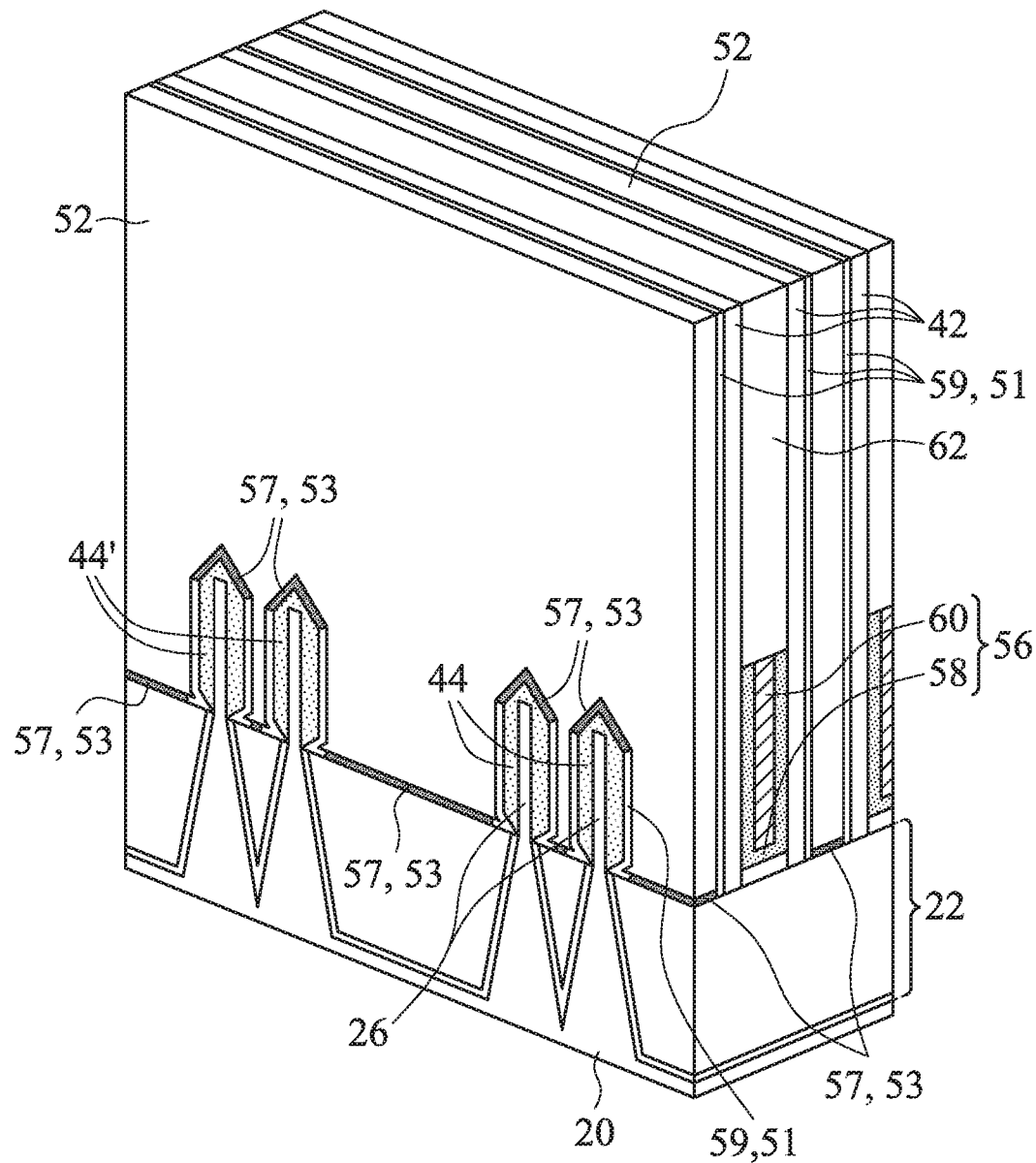

FIG. 11 illustrates the formation of replacement gate 56, which includes replacement gate dielectric 58 and replacement gate electrode 60. The formation of replacement gate 56 includes performing an etching step to remove the dummy gate stack 30 as shown in FIG. 10, and forming replacement gate 56 in the recess left by the removed dummy gate stack 30. Gate dielectric 58 may include an interfacial oxide layer, and a high-k dielectric layer over the interfacial oxide layer. The interfacial layer may include an oxide layer such as a $SiO_2$ layer, which may be formed through the thermal oxidation of the respective fin 26, a chemical oxidation process, or a deposition process. In some cases, the interfacial layer may include a SiN layer, and in some cases the interfacial layer may include one or more layers of $SiO_2$, SiN, or another material. In accordance with some embodiments of the present disclosure, the high-k dielectric has a k value greater than about 7.0, and may include a metal oxide or a silicate of Hf, Al, Zr, La, or the like. Replacement gate electrode 60 may include a metal-containing material such as TiN, TaN, TaC, Co, Ru, Al, Cu, W, combinations thereof, or multi-layers thereof. The formation processes of the replacement gate 56 may include forming additional layers such as barrier layers, capping layers, work-function layers, or other layers not shown in FIG. 11 for clarity. These additional layers may include materials such as TiN, TaN, W, SiN, SiOCN, or other materials.

A CMP is performed to remove the excess portions of gate dielectric 58 and gate electrode 60 over gate spacers 40. Replacement gate 56 may be etched back, followed by filling dielectric material 62 in the recess formed by the etch-back. A CMP is then performed to planarize the top surfaces of dielectric material 62, gate spacers 42, and ILD 52. The CMP may be performed until the mask 54 as shown in FIG. 10 has been removed.

Figure 12:
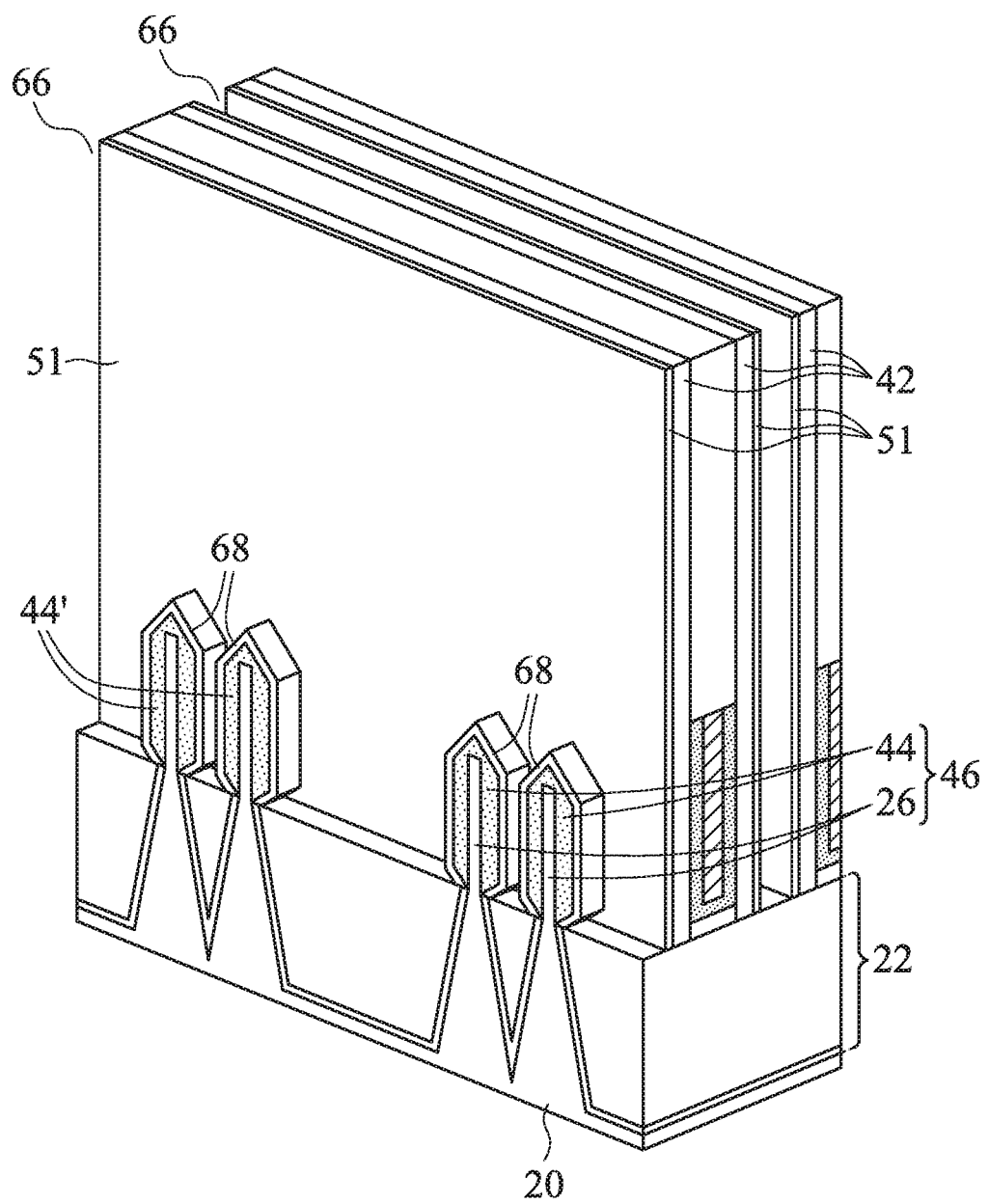
Figure 13:
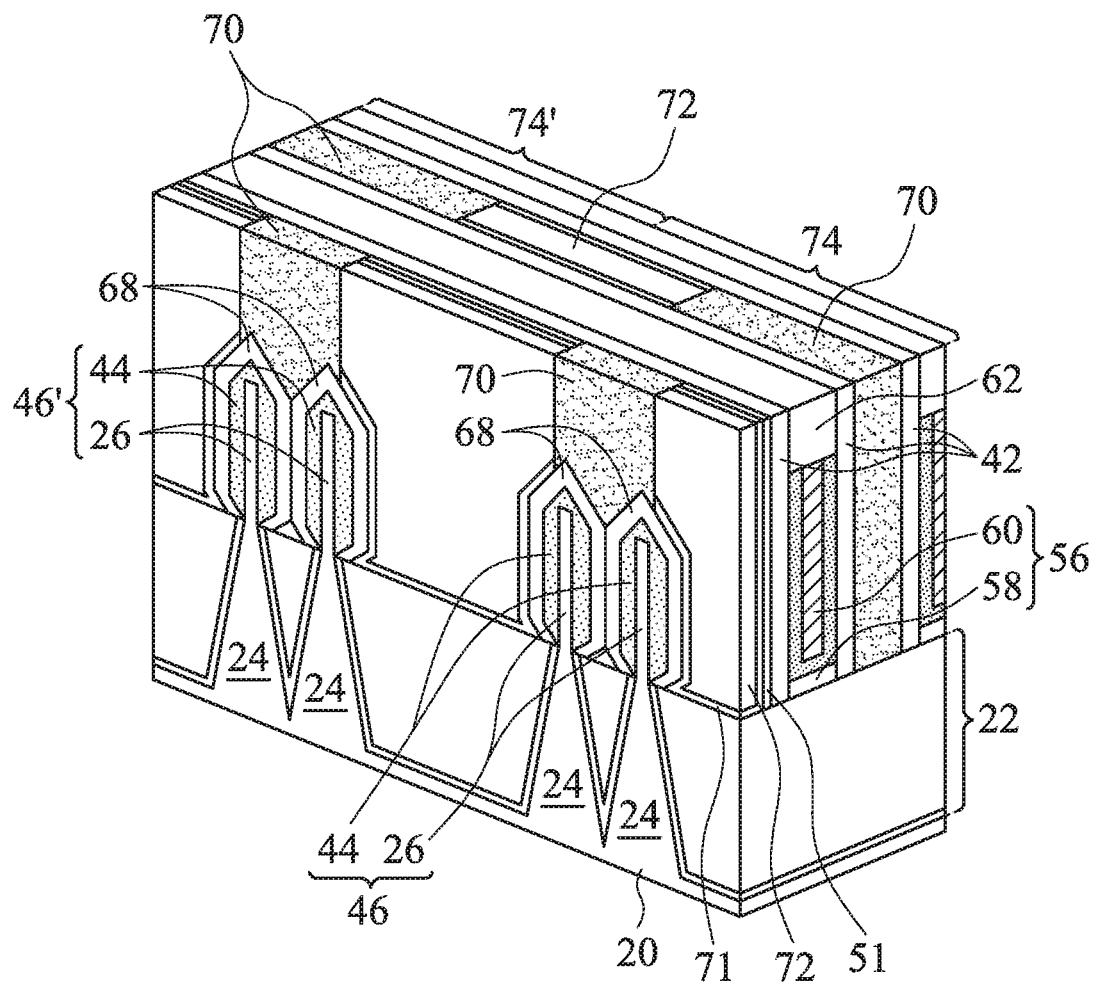
Figure 14:
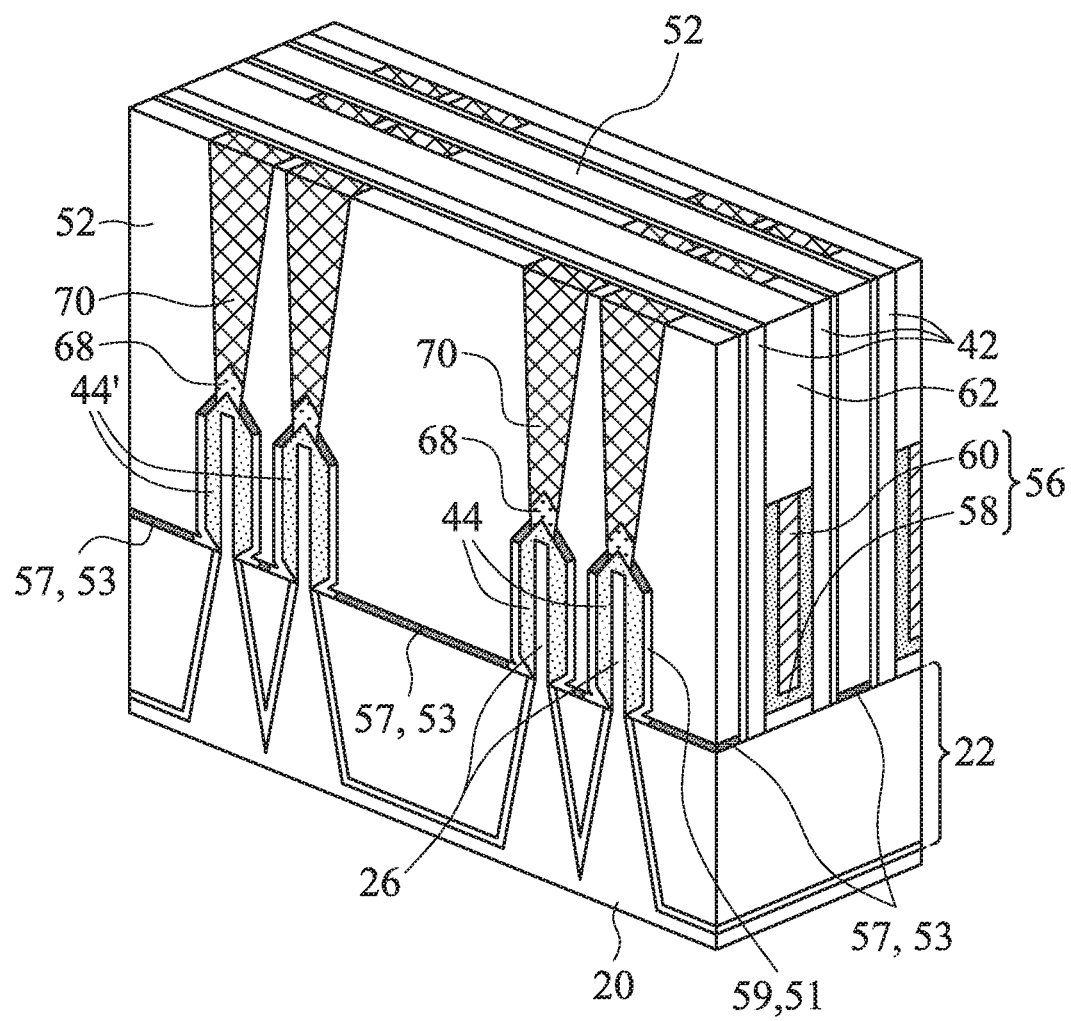
Figure 15:
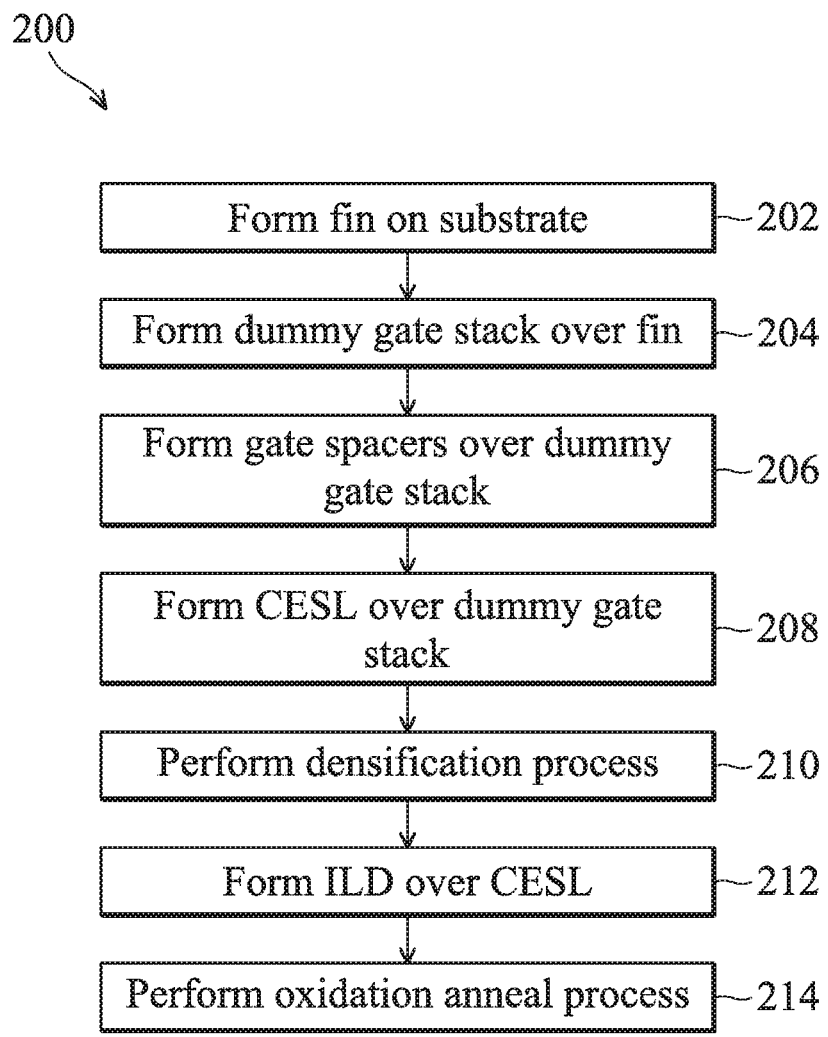
FIG. 15 illustrates a process flow for forming a FinFET in accordance with some embodiments.

FIGS. 12 and 13 illustrate the formation of source/drain silicide regions and contact plugs in accordance with some embodiments. It is appreciated that the embodiments shown in FIGS. 12 and 13 are exemplary, and different processes may be used. A different example process is shown in FIG. 14, described below. ILD 52 in FIG. 8 is first removed, forming recesses 66 as shown in FIG. 12. In some cases, some or all of oxygenated vertical CESL portions 59 or oxygenated horizontal CESL portions 57 of CESL 50 are removed with ILD 52. The amount of oxygenated vertical CESL portions 59 or oxygenated horizontal CESL portions 57 of CESL 50 that are removed with ILD 52 may depend on the oxygen concentration profile of the oxygenated vertical CESL portions 59 or oxygenated horizontal CESL portions 57 of CESL 50. Remaining portions of CESL layer 50 (e.g., some or all of vertical CESL portions 51, horizontal CESL portions 53, oxygenated vertical CESL portions 59, or oxygenated horizontal CESL portions 57) are thus exposed. The remaining portions of CESL layer 50 may be used as an etch stop layer for etching ILD 52. Some remaining horizontal portions of CESL layer 50 are then etched, exposing epitaxy regions 44 and 44'. Some of vertical CESL portions 51 or oxygenated vertical CESL portions 59 may remain on gate spacers 42 or on epitaxy regions 44 and 44'. For clarity, in FIGS. 12 and 13, only a remaining vertical CESL portion 51 on gate spacers 42 is shown. Next, silicide regions 68 are formed by siliciding the surface portions of epitaxy regions 44 and 44', wherein the siliciding includes depositing a conformal metal layer (such as titanium, cobalt, or like, not shown), performing an anneal to react the metal layer with epitaxy regions 44 and 44', and remove the unreacted portions of the metal layer.

FIG. 13 illustrates the formation of contact plugs 70 and ILD 72. In accordance with some embodiments of the present disclosure, etch stop layer 71 is formed, and then ILD 72 is formed to fill recesses 66, followed by a CMP to planarize ILD 72. Openings (filled by contact plugs 70) are then formed to expose at least some portions source/drain silicide regions 68. The openings are then filled with a metallic material such as tungsten. Another CMP process is performed to remove the excess metallic material, leaving contact plugs 70. N-type FinFET 74 and p-type FinFET 74' are thus formed. In subsequent processes, gate contact plugs (not shown) are formed to electrically connect to replacement gate electrode 60.

FIG. 14 illustrates the formation of contact plugs 70 in accordance with some embodiments. The process illustrated in FIG. 14 may be performed instead of the process shown in Figure and FIG. 13. After the CMP as described above with respect to FIG. 11, portions of ILD 52 and CESL 50 are removed to form openings (filled by contact plugs 70). Source/drain silicide regions 68 are then formed on the surfaces of epitaxy regions 44 and 44'. The silicide formation process may include depositing a metal layer into the openings, and performing an anneal to react the metal layer with the exposed surface portions of epitaxy regions 44 and 44', so that silicide regions 68 are formed. In accordance with some embodiments, unreacted portions of the metal layer are removed. In accordance with alternative embodiments, the unreacted portions of the metal layer remain unremoved. A conductive material such as tungsten is then filled into the contact openings to form contact plugs 70. A CMP process is performed to remove excess metallic material. In subsequent processes, gate contact plugs (not shown) are formed to electrically connect to replacement gate electrode 60.

The embodiments of the present disclosure have some advantageous features. Some or all of the CESL adjacent the gate spacers may be converted to a material with a lower dielectric constant. The CESL may be converted using a combination of a densification process and an oxidation anneal process. In this manner, parasitic capacitances within the device may be reduced, and the performance of the device may be improved. In particular, AC and high-speed performance of the device may be improved.

In an embodiment, a method comprises forming a dummy gate stack on a substrate; forming a spacer layer on the dummy gate stack; forming an etch stop layer over the spacer layer and the dummy gate stack, the etch stop layer comprising a vertical portion and a horizontal portion; performing a densification process on the etch stop layer, wherein the horizontal portion is denser than the vertical portion after the densification process; forming an oxide layer over the etch stop layer; performing an anneal process on the oxide layer and the etch stop layer, wherein the vertical portion has a greater concentration of oxygen than the horizontal portion after the anneal process; forming a plurality of source/drain regions in the substrate; removing the dummy gate stack to leave an opening; and forming a replacement gate stack within the opening. In an embodiment, the densification process is a direct plasma process comprising bombarding the etch stop layer with ions. In another embodiment, the ions are argon ions. In another embodiment, the densification process is performed at the same time as the forming of the etch stop layer. In another embodiment, the oxide layer comprises a flowable oxide. In another embodiment, the anneal process comprises a steam anneal. In another embodiment, the method further comprises etching the etch stop layer after performing the anneal process, wherein some of the vertical portion of the etch stop layer remains on the spacer layer after etching the etch stop layer. In another embodiment, the etch stop layer is formed using a plasma-enhanced atomic layer deposition (PE-ALD) process.

In an embodiment, a method comprises forming a gate spacer on sidewalls of a dummy gate stack; forming a first dielectric layer over the gate spacer and the dummy gate stack, the first dielectric layer comprising a first material, wherein first portions of the first dielectric layer adjacent the dummy gate stack are denser than second portions of the first dielectric layer adjacent the gate spacer; forming a second dielectric layer over the first dielectric layer, the second dielectric layer comprising a second material different from the first material; and performing an anneal process, wherein the anneal process coverts second portions of the first material into the second material at a faster rate than the anneal process converts first portions of the first material into the second material. In an embodiment, the first material is SiN and the second material is $SiO_2$. In another embodiment, the anneal process forms a third material between the first material and the second material, the third material comprising SiON. In another embodiment, the anneal process is a steam anneal process. In another embodiment, the first dielectric layer is formed to a thickness between about 30 nm and about 50 nm. In another embodiment, forming the first dielectric layer comprises using a plasma-enhanced atomic layer deposition (PE-ALD) process. In another embodiment, the PE-ALD process comprises using a direct plasma. In another embodiment, the direct plasma comprises argon ions.

In an embodiment, a device comprises a fin protruding from a substrate; a gate stack disposed over the fin; a gate spacer disposed on sidewalls of the gate stack; an etch stop layer disposed on the gate spacer and the substrate; wherein first portions of the etch stop layer adjacent the gate spacer have a higher concentration of oxygen than second portions of the etch stop layer adjacent the substrate; and an interlayer dielectric (ILD) disposed over the etch stop layer. In an embodiment, third portions of the etch stop layer adjacent the substrate have a greater density than fourth portions of the etch stop layer adjacent the gate spacer. In another embodiment, fifth portions of the etch stop layer adjacent the substrate have a greater dielectric constant than sixth portions of the etch stop layer adjacent the gate spacer. In another embodiment, the etch stop layer comprises SiN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin protruding from a substrate;
   a gate structure disposed on sidewalls and a top surface of the fin;
   a spacer layer on sidewalls of the gate structure;
   a source/drain region on the fin adjacent the gate structure;
   an etch stop layer on sidewalls of the spacer layer and on the source/drain region, wherein a first portion of the etch stop layer on the sidewall of the spacer layer has a smaller density than a second portion of the etch stop layer on the source/drain region; and
   an interlayer dielectric layer (ILD) over the etch stop layer.

2. The semiconductor device of claim 1, comprising a contact plug extending through the ILD and the etch stop layer to the source/drain region.

3. The semiconductor device of claim 1, wherein the etch stop layer comprises silicon oxynitride, wherein the first portion of the etch stop layer has a greater concentration of oxygen than the second portion of the etch stop layer.

4. The semiconductor device of claim 1, wherein the etch stop layer comprises a layer of silicon nitride, wherein the layer of silicon nitride is thinner in the first portion of the etch stop layer than in the second portion of the etch stop layer.

5. The semiconductor device of claim 1, wherein the ILD comprises a flowable oxide.

6. The semiconductor device of claim 1, wherein the etch stop layer extends over a top surface of the substrate.

7. The semiconductor device of claim 6, wherein a third portion of the etch stop layer over the top surface of the substrate has a greater density than the first portion of the etch stop layer.

8. A device comprising:
   a first semiconductor fin over a substrate;
   a gate stack on the first semiconductor fin;
   a spacer layer on sidewalls of the gate stack;
   an etch stop layer over the spacer layer;
   an interlayer dielectric layer (ILD) over the etch stop layer, wherein first regions of the etch stop layer contacting the spacer layer have a smaller concentration of oxygen than second regions of the etch stop layer contacting the ILD; and
   a first source/drain region on the first semiconductor fin adjacent the gate stack.

9. The device of claim 8, wherein the first regions have a greater dielectric constant than the second regions.

10. The device of claim 8, wherein third regions of the etch stop layer extend over surfaces of the first source/drain region.

11. The device of claim 10, wherein the third regions of the etch stop layer have a smaller concentration of oxygen than the first regions.

12. The device of claim 8, wherein surfaces of the first source/drain region are free of the etch stop layer.

13. The device of claim 8, wherein the first regions of the etch stop layer comprise silicon nitride and wherein the second regions of the etch stop layer comprise silicon oxynitride.

14. The device of claim 8, further comprising a second semiconductor fin over the substrate adjacent the first semiconductor fin and further comprising a second source/drain region on the second semiconductor fin, wherein the etch stop layer extends over the substrate from the first source/drain region to the second source/drain region.

15. A method comprising:
    forming a fin on a substrate;
    forming a gate stack on the fin;
    forming spacers on sidewalls of the gate stack;
    forming epitaxial source/drain regions adjacent the spacers;
    forming a dielectric layer extending over the spacers and over the epitaxial source/drain regions;
    performing a plasma process on first portions of the dielectric layer, wherein after performing the plasma process the first portions of the dielectric layer have a greater density than second portions of the dielectric layer; and
    performing an anneal process on the dielectric layer, wherein after performing the anneal process the first portions of the dielectric layer have a smaller concentration of oxygen than the second portions.

16. The method of claim 15, further comprising removing the dielectric layer from over the epitaxial source/drain regions.

17. The method of claim 15, further comprising forming an oxide layer over the dielectric layer before performing the anneal process.

18. The method of claim 15, wherein the second portions of the dielectric layer are on the spacers.

19. The method of claim 15, wherein the plasma process comprises directing ions at the first portions of the dielectric layer.

20. The method of claim 15, wherein the anneal process comprises a steam anneal.

* * * * *